United States Patent
Beck et al.

(10) Patent No.: US 9,462,720 B1
(45) Date of Patent: Oct. 4, 2016

(54) Z-LIFT LINE-CARD BLIND MATE INSERTION/MATING

(71) Applicant: Google Inc., Mountain View, CA (US)

(72) Inventors: Jonathan David Beck, Mountain View, CA (US); Kenneth Dale Shaul, Sunnyvale, CA (US); Soheil Farshchian, San Jose, CA (US); Roy Michael Bannon, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 142 days.

(21) Appl. No.: 14/167,664

(22) Filed: Jan. 29, 2014

(51) Int. Cl.
*H05K 7/14* (2006.01)

(52) U.S. Cl.
CPC .................................. *H05K 7/1461* (2013.01)

(58) Field of Classification Search
None
See application file for complete search history.

(56) References Cited

U.S. PATENT DOCUMENTS

| | | | |
|---|---|---|---|
| 4,161,017 A * | 7/1979 | Pierce et al. | 361/784 |
| 4,678,252 A * | 7/1987 | Moore | 439/62 |
| 4,778,401 A | 10/1988 | Boudreau et al. | |
| 4,795,891 A | 1/1989 | Morigaki | |
| 4,901,204 A * | 2/1990 | Hayashi | 361/807 |
| 4,979,075 A * | 12/1990 | Murphy | 361/679.32 |
| 5,002,494 A * | 3/1991 | Olsson | 439/77 |
| 5,026,297 A * | 6/1991 | Krehbiel | 439/326 |
| 5,396,102 A * | 3/1995 | Toshio et al. | 257/723 |
| 5,673,175 A * | 9/1997 | Carney et al. | 361/679.58 |
| 5,774,343 A * | 6/1998 | Benson et al. | 361/796 |
| 5,926,378 A * | 7/1999 | DeWitt et al. | 361/788 |
| 5,999,621 A | 12/1999 | Martin et al. | |
| 6,071,143 A * | 6/2000 | Barthel | G06F 1/184 439/377 |
| 6,234,820 B1 * | 5/2001 | Perino et al. | 439/326 |
| 6,270,369 B1 * | 8/2001 | Kato et al. | 439/326 |
| 6,341,063 B2 * | 1/2002 | Kinoshita et al. | 361/690 |
| 6,498,731 B1 * | 12/2002 | Roscoe et al. | 361/796 |
| 6,791,843 B1 * | 9/2004 | Dobbs et al. | 361/758 |
| 6,822,878 B2 * | 11/2004 | Dobbs et al. | 361/807 |
| 6,896,539 B2 * | 5/2005 | Dobbs et al. | 439/376 |
| 6,956,746 B2 * | 10/2005 | Barsun et al. | 361/785 |
| 6,966,784 B2 * | 11/2005 | Van Schuylenbergh et al. | 439/67 |
| 6,967,847 B2 * | 11/2005 | Barsun et al. | 361/727 |
| 6,980,440 B2 | 12/2005 | Nieman et al. | |
| 7,057,901 B2 * | 6/2006 | Roscoe et al. | 361/796 |
| 7,154,761 B1 * | 12/2006 | Camerlo et al. | 361/788 |
| 7,355,861 B2 | 4/2008 | Durney et al. | |
| 7,374,429 B2 * | 5/2008 | Cronch et al. | 439/67 |
| 7,920,387 B2 | 4/2011 | Barrett et al. | |
| 8,630,094 B2 * | 1/2014 | Hsiao | 361/726 |
| 2005/0078461 A1 * | 4/2005 | Dobbs | H05K 7/1418 361/756 |
| 2005/0090137 A1 * | 4/2005 | Gottlieb | 439/342 |
| 2008/0123274 A1 * | 5/2008 | Desrosiers et al. | 361/683 |
| 2014/0004723 A1 * | 1/2014 | Costello | 439/64 |

* cited by examiner

*Primary Examiner* — Xanthia C Cunningham

(74) *Attorney, Agent, or Firm* — Lerner, David, Littenberg, Krumholz & Mentlik, LLP

(57) ABSTRACT

An aligning apparatus for mounting cards into a housing space is provided. The aligning apparatus includes a first line card having a mating portion and a card guide assembly coupled to the first line card. The mating portion is configured to mate with a backplane of the housing space. The card guide assembly varies from a first height at a first portion to a second height at a second portion. The varying heights correspond to an arrangement of components on a neighboring card. The first and second portions are configured to guide directional movement of the first line card in relation to one or more components on the neighboring card during insertion of the first line card into the housing space. In this regard, the first line card is guided past the one or more components on the neighboring card as the mating portion of the first line card is moved toward the backplane.

20 Claims, 7 Drawing Sheets

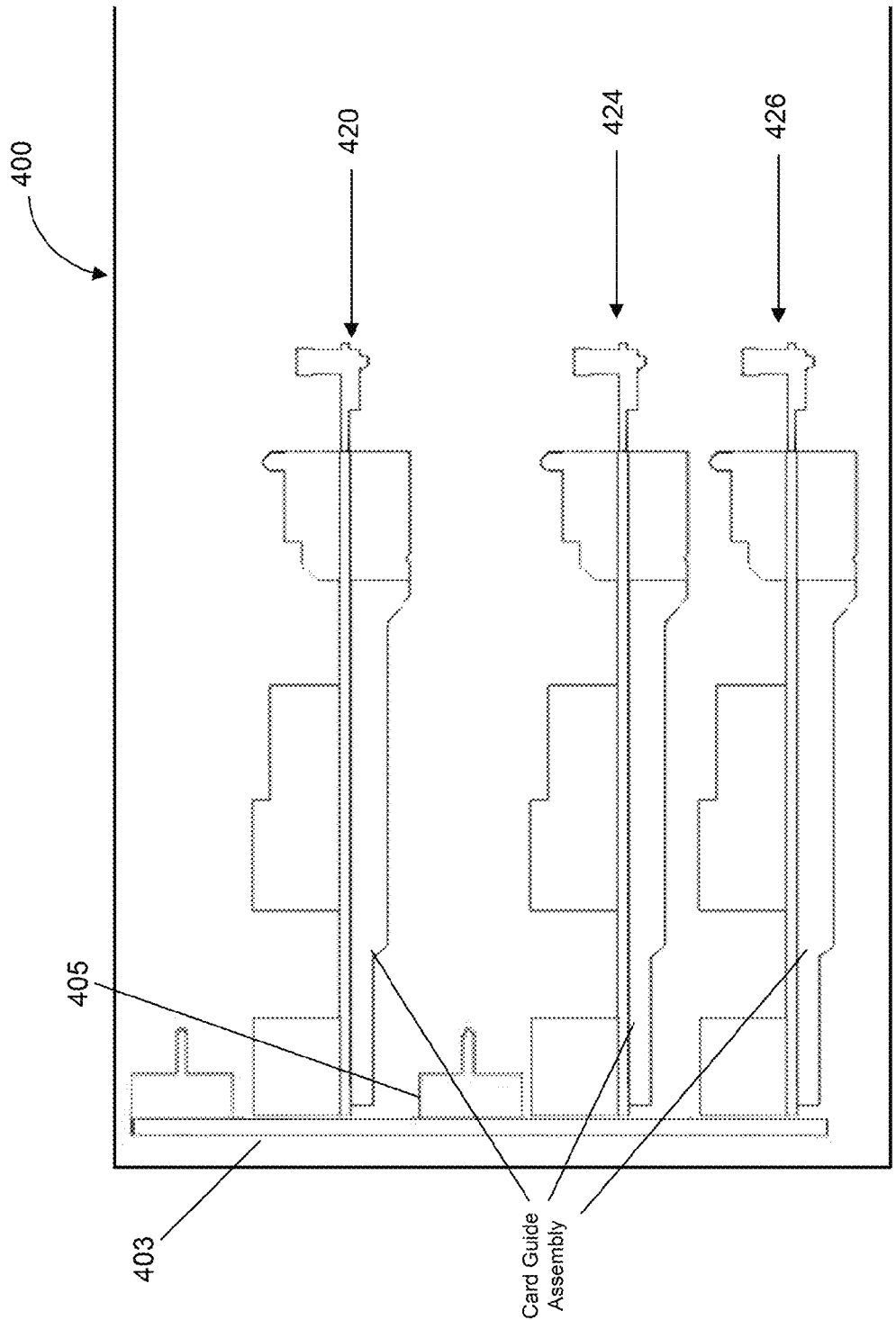

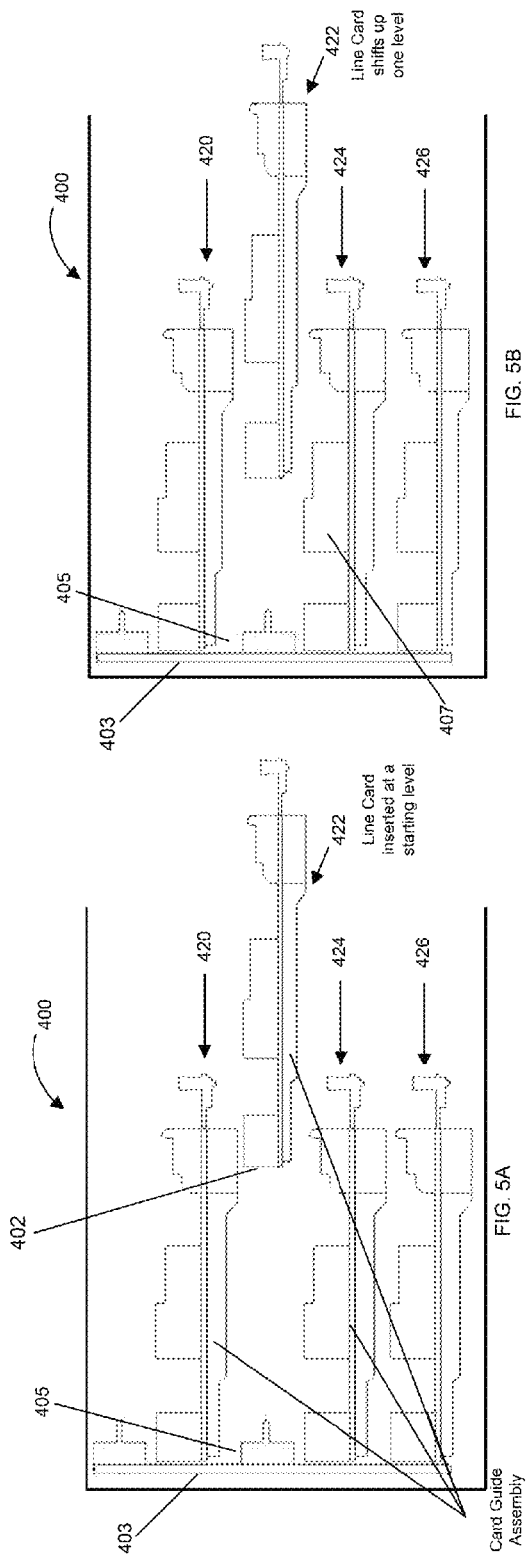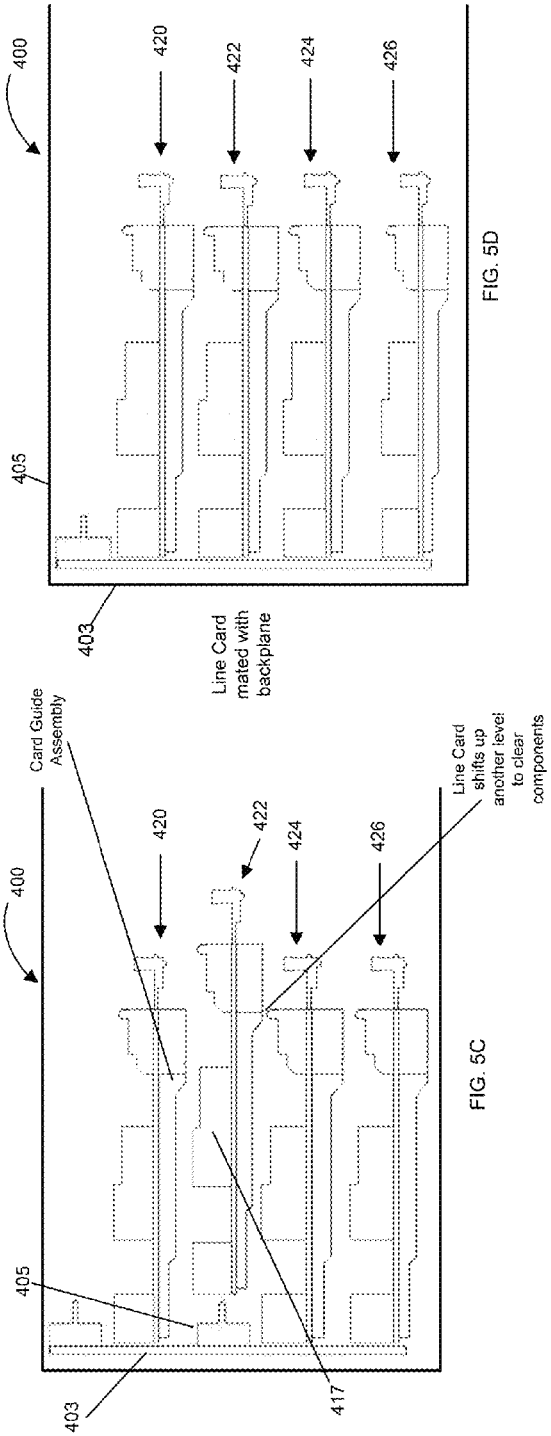

Z-LIFT LINE-CARD BLIND MATE INSERTION/MATING

BACKGROUND

Equipment racks of servers and other types of networking computers generally consist of line card modules, such as a printed circuit board (PCB). The line card modules can be inserted into the equipment racks to connect with a backplane. Typically, the equipment rack's chassis is configured to house many of these line cards. The limit of how big you can build the chassis with a single backplane depends on the size of that backplane. Further, the size of the backplane determines the number of line card modules that the chassis can hold. For example, a backplane of a certain height (e.g., 3 feet) can only hold so many line card modules. Some servers may include additional backplanes for attaching more line card modules. Other servers may use cables to connect additional line card modules to the backplane.

SUMMARY

Aspects of the disclosure provide an apparatus for mounting line cards in a "nested" configuration. This may allow for a maximum alignment of the line cards in housing, such as an equipment rack or a network switch. In one aspect, an aligning apparatus for mounting cards into a housing space is provided. The aligning apparatus includes a first line card that has a mating portion and a card guide assembly coupled to the first line card. The mating portion is configured to mate with a backplane of the housing space. The card guide assembly varies from a first height at a first portion to a second height at a second portion. The varying heights correspond to an arrangement of components on a neighboring card. The first and second portions are configured to guide directional movement of the first line card in relation to one or more components on the neighboring card during insertion of the first line card into the housing space.

In one example, the guide assembly includes a tray coupled along a length of the line card, and first and second portions of the tray correspond to the first and second portions of the card guide assembly. The card guide assembly is configured to cause the first line card to shift a predetermined height within in the housing space. The predetermined height corresponds to either the first and second heights of the card guide assembly. In another example, the card guide assembly includes one or more rollers attached to the first and second portions. In this regard, the aligning apparatus further includes one or more guide ramps positioned in the housing. The guide ramps are configured to engage the rollers. In yet another example, the card guide assembly includes a third height at a third portion coupled to the second portion. The third height associated with the third portion corresponds to the arrangement of components on the neighboring card.

In another aspect, a system for mounting cards is provided. The system includes a housing that has a backplane and a number of daughter cards. Each daughter card has a mating portion for mating with the backplane. A card guide assembly is coupled to each daughter card. The card guide assembly varies from a first height at a first portion to at least a second height at a second portion. The varying heights correspond to an arrangement of components on a neighboring daughter card. The first and second portions are configured to guide directional movement of a given daughter card in relation to the neighboring daughter card during insertion of the given daughter card into the housing. In this regard, the given daughter card is guided past one or more components on the neighboring card as the mating portion of the given daughter card is moved toward the backplane.

BRIEF DESCRIPTION OF THE DRAWINGS

FIG. 4 depicts a number of line cards within housing in accordance with aspects of the disclosure.

FIGS. 5A-5D depicts examples of a line card inserted into the housing of FIG. 4 in accordance with aspects of the disclosure.

DETAILED DESCRIPTION

Aspects, features and advantages of the disclosure will be appreciated when considered with reference to the following description of embodiments and accompanying figures. The same reference numbers in different drawings may identify the same or similar elements. Furthermore, the following description is not limiting; the scope of the present technology is defined by the appended claims and equivalents.

The present disclosure relates generally to providing an apparatus that allows daughter or line cards to be mounted in a "nested" configuration. In some embodiments, this may allow for greater port density and better signal fidelity at a particular housing for the cards by minimizing a backplane height of the housing to which the line cards are mated. By using the techniques described herein, an arrangement of housing slots for accepting the line cards can be maximized for a certain amount of available space in a particular housing.

The line cards are designed to include a type of "z-lift" feature that permits a closer nesting of the cards than can be possible with an arrangement of cards that do not include this feature. The z-lift features allow the line cards to avoid or otherwise move around one or more electrical components attached to a faceplate of a neighboring line card. For example, as the line cards are moved through the housing in order to mate them with a backplane, those line cards having the z-lift features will move towards a particular side of the housing for a vertical card deployment, or "dive" below the neighboring card's faceplate in a horizontal deployment, thus avoiding components attached to the neighboring card.

According to aspects, these z-lift features can be implemented in several ways. In one example, the z-lift features include a type of card guide assembly arranged on the line card so that it rests between the card and a neighboring card. In this regard, the z-lift features of card guide assembly include multiple levels of varying heights. These levels help guide a directional movement of the line card in relation to a neighboring card during insertion of the card into the housing. Because of this, the levels correspond to an arrangement of components on the neighboring card. In other examples, the z-lift features of card guide assembly may include rollers and/or guiderails or other types of assemblies that are configured to move the card in a certain direction as it is pushed into position at the housing.

Figure 1:
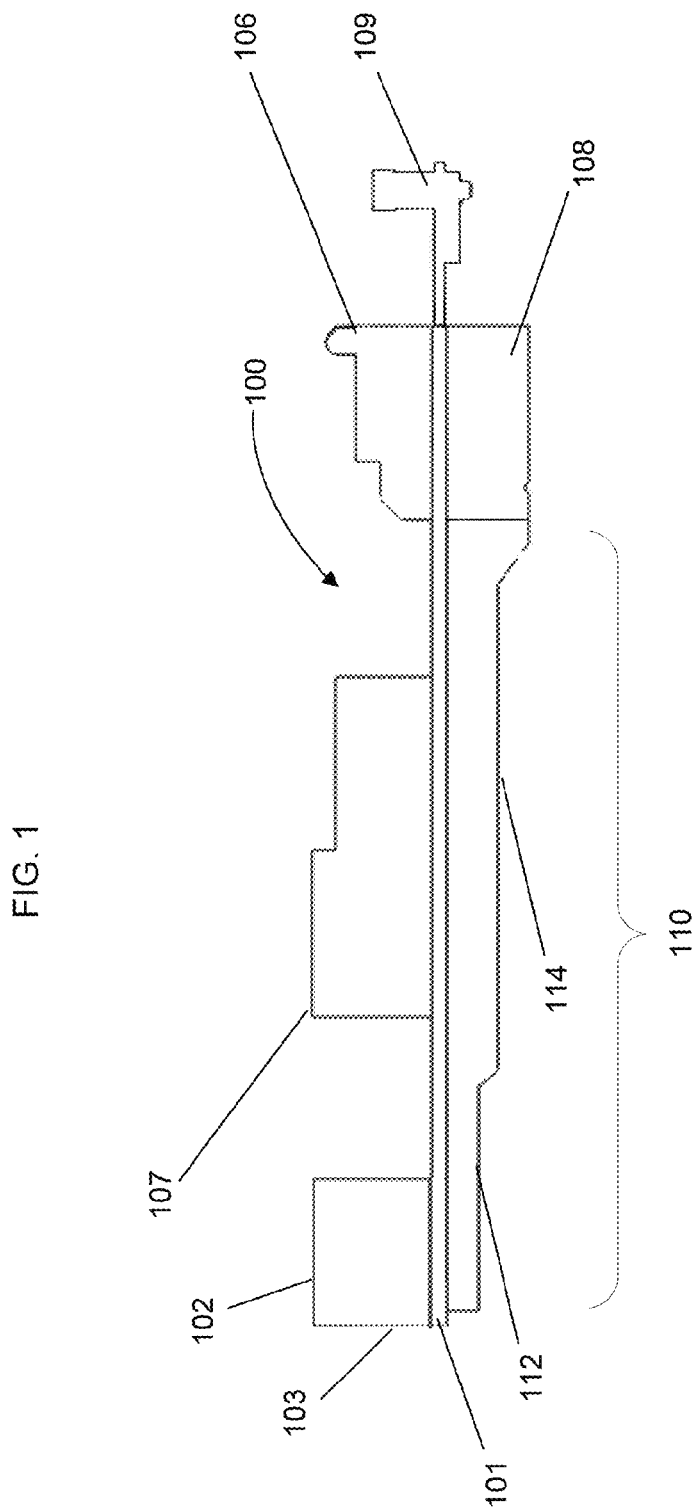
FIG. 1 depicts an example line card in accordance with aspects of the disclosure.

FIG. 1 depicts a line card 100, which includes z-lift aligning features. In this example configuration, the line card 100 includes a body 101 that has an upper and a lower portion. Upon this body 101, one or more electrical components are attached. For example, as shown in FIG. 1, components 102, 106 and 107 are attached to an upper portion of the body 101, while component 108 is shown attached to a lower portion of the body 101. The components 102-108 can be of varying dimensions depending upon each individual component's needs. For example, each individual component's dimensions may vary based on the internal circuitry of that component and its location on the line card 100. As shown here in FIG. 1, line card 100 is higher at one portion due to the height of component 102 than it is at another portion near component 106.

Once inserted into a housing slot, line card 100 electrically connects its various components 102-108 to the housing. For example, the line card 100 may mate with a backplane of the housing when it is inserted into a preconfigured housing slot. The line card 100 and the housing typically will make an electrical connection at the preconfigured housing slot as part of the mating process. The backplane can be used to connect several line cards together, or to a central resource such as a server.

In some embodiments, a user may manipulate the line card into the housing slot. For example, the line card 100 may include a handle 109 or some other type of gripping device at one end which the user may use to grip the card. Using this handle, the user may maneuver the line card 100 (for example, by pushing it) through the housing so that it can mate with the backplane.

To mate with the backplane, the line card 100 includes a mating connector. For example, component 102 of line card 100 may include one or more pins (not shown) on one side that can mate with corresponding pins on the backplane. These pins may be fixed, for example, on a mating portion 103 of component 102. When the line card is fully inserted into the housing, the card may contact the backplane such that each pin on the mating portion 103 may contact and form an electrical connection with a pin on the backplane. The connection between the pins may not be one-on-one. For example, less than all of the pins on the line card may contact and connect with a pin on the backplane, and some pins on the card may contact and connect with more than one pin on the backplane.

When the line card 100 is inserted into the housing, the mating portion 103 may enter the housing's chassis first. As the line card is further moved into the housing, it must be maneuvered past components on other neighboring line cards so that its mating portion 103 can reach the backplane. In some instances, the backplane cannot be seen by a user that is maneuvering the card.

To assist with maneuvering the line card 100 into the housing, the card includes a card guide assembly 110 attached along the lower portion of the body 101. In this example, the card guide assembly 110 is shaped to cause the line card 100 to shift in a certain direction to avoid components on a neighboring line card. For example, the card guide assembly 110 may include a tray attached to a lower portion of the body 101 of line card 100. The tray may be made out of sheet metal, plastic or any other suitable material. This tray provides mechanical stability and protection as well as forming aspects of the z-lift system for guiding the card in two dimensions during placement. For example, the tray may be shaped to include varying heights with slopes that form at least a first level 112 and second level 114 of the card guide assembly 110.

According to aspects, the card guide assembly 110 can guide the direction of movement of the line card 100. For example, as line card 100 moves through the housing's chassis, the card guide assembly 110 of line card 100 causes elevation changes in the card's normal direction in relation the other line cards. For example, the card guide assembly 110 may cause the line card 100 to shift up and down while inserting the card into the housing. These changes in elevation correspond to the height of a particular portion of the card guide assembly 110. For example, the change in elevation may be substantially similar or slightly greater than the height of the particular portion of the card guide assembly 110 in order for that portion to move pass components on a neighboring card.

In a vertical deployment of line cards, the card guide assembly 110 may cause the line card 100 to shift from side-to-side or in other words shift a certain distance towards a particular side of the housing. For example, the card guide assembly 110 may cause the line card 100 to shift to a left side or right side of the housing a certain distance corresponding to a portion of the card guide assembly 110.

The card guide assembly 110 allows the line card 100 to move further into the housing without bumping into components on the neighboring line cards. For this reason, the first and second levels 112 and 114 of the card guide assembly 110 are configured to correspond with an arrangement of components on the neighboring cards. This special configuration of components on the line cards is further discussed later with respect to FIGS. 3A-3B.

Figure 2:
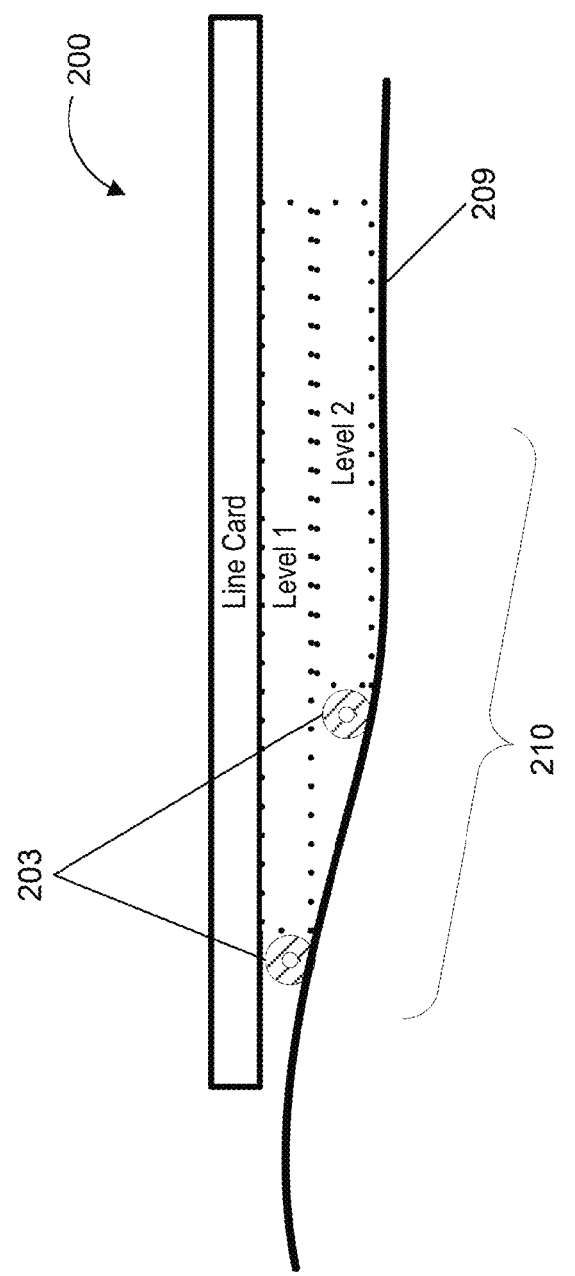
FIG. 2 depicts another example line card in accordance with aspects of the disclosure

FIG. 2 depicts another example line card 200. In this example configuration, line card 200 includes a card guide assembly 210 that has one or more rollers 203. The rollers 203 can be small wheels or other types of rolling devices. As shown, the rollers 203 can be attached at each level of the card guide assembly 210. For example, the rollers 203 can be attached to a tray shaped to include the first and second levels of the card guide assembly 210. In other examples, a guide ramp 209 can engage the rollers in order to guide the line card in a particular direction. For example, the one or more rollers 203 may be positioned at the guide ramp 209 so that the rollers 203 can roll along the ramp by pushing the line card 201.

As the card moves, the guide ramp 209 will cause the card to rise or otherwise move past the components on a neighboring card. In some aspects, the guide ramp 209 can be attached within a chassis of the housing so that the ramp is positioned at a left side and a right side of the card guide assembly 210, for example, when the line card 200 is inserted into the housing. The guide ramp 209 may be a rail, guide rail, track, guide track or other types of guiding devices that can be used for guiding the line card to complement its z-lift features. Further aspects of the z-lift features of the card guide assembly 110 are described below with respect to FIG. 3A.

Figure 3A:
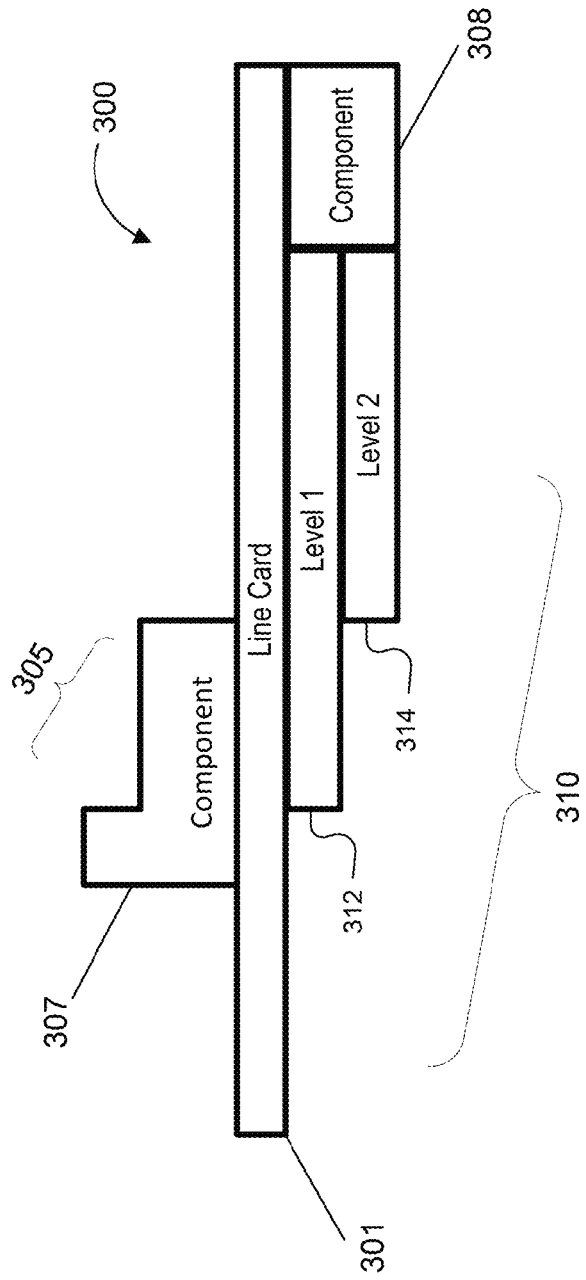
FIG. 3A depicts a block diagram of a line card in accordance with aspects of the disclosure.

In FIG. 3A, a block diagram of a line card 300 is shown. In this example configuration, the line card 300 has a body 301 with upper and lower portions. Here, the line card 300 includes one or more components 307 and 308 attached to the body 301. The line card 300 also includes z-lift features disposed on the body 301 that allow the card to move around components attached to a neighboring line card. For example, line card 300 includes a card guide assembly 310 that has a first level or portion 312 and a second level or portion 314 disposed on the lower portion of the body 301. By using the z-lift features, line card 300 will not just slide straight in and out of a housing, but rather it will be constrained to move in a second direction (for example, shift up and down or shift to the side). Thus, the line card 300 will shift in sought of a "z" like pattern as it moves through the housing in order to nest with other neighboring line cards.

To assist with the nesting of cards, one or more components of the line cards are shaped to complement the aligning features of the card guide assembly 310. For example, the components can be shaped to be longer or higher at one portion than at another portion in order to form steps on a surface of the card. Some components on the line card, such as a heat sink component, can also be formed into steps. Another advantage of the steps is that the higher portions can grow in size so that these specially configured components can be more efficient than other component without the steps. For example, a heat sink component configured with one portion higher that another can include longer air ducks within the higher portions for better air flow efficiency.

As shown in FIG. 3A, component 307 of line card 300 is configured to include rising step 305. This particular step shape of component 307 will aid in the guiding capabilities of the card guide assembly 310 as the line card 300 is moved past a neighboring line card. For example, this step shape may allow the line card 300 to move from one level to the next while component 307 avoids other components hanging from a neighboring card positioned above. In some aspects, the components of the line card 300 can also be arranged to form steps. For example, certain higher components can be arranged at opposite ends or behind lower components on the line card. This arrangement of components of difference heights will form steps on the line card. Without these step features, the minimum required pitch, e.g., degrees of freedom for movement, for line card 300 would equal the maximum distance between the tallest component underneath the line card 300 and the tallest component installed on the upper portion of the card.

Figure 3B:
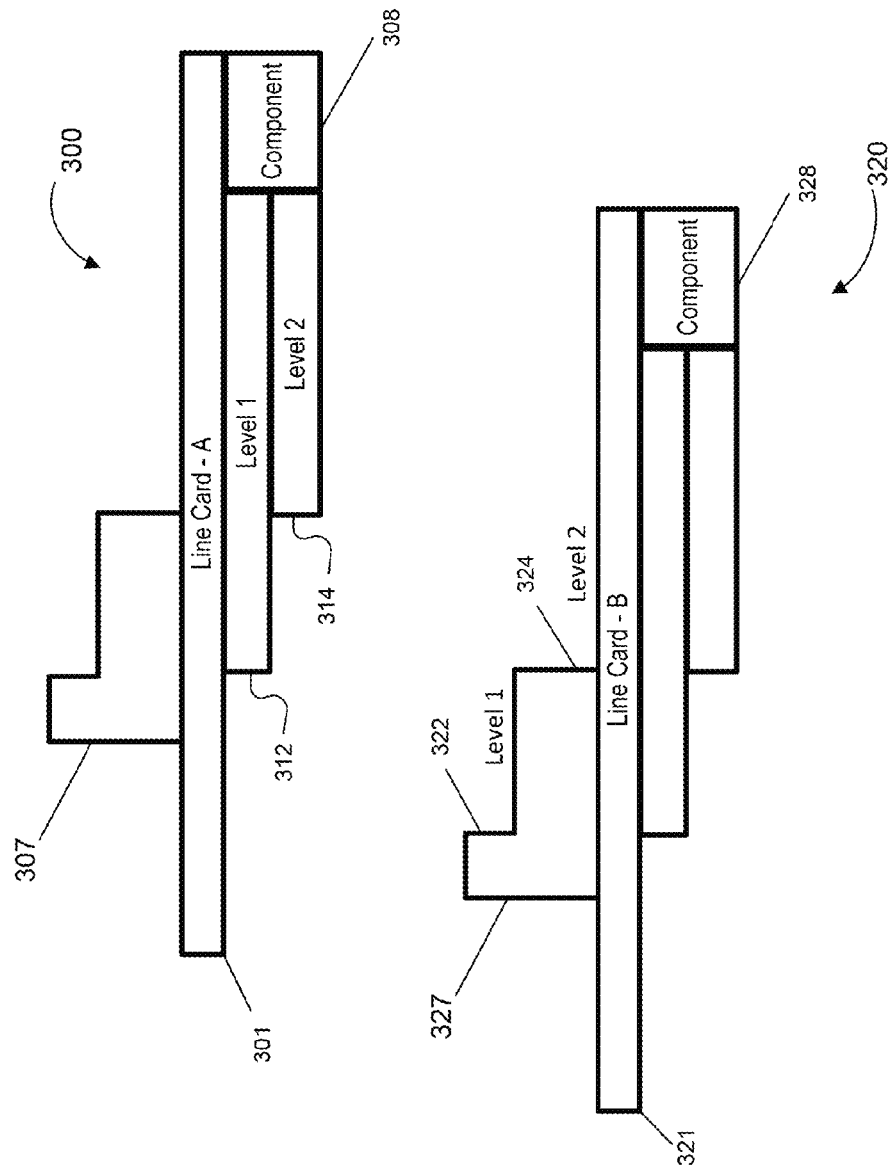
FIG. 3B depicts a block diagram of neighboring line cards in accordance with aspects of the disclosure.

FIG. 3B depicts block diagrams of neighboring line cards 300 and 320. For example, line cards 300 and 320 may be neighbors to each other when installed in certain housing, such as a network server. As discussed above, line card 300 has a body 301 with upper and lower portions and one or more components 307, 308 attached to the body 301. The line card 300 also includes a card guide assembly 310 that has a first level 312 and a second level 314 disposed along the lower portion of the body 301. In some aspects, these levels may correspond to a configuration of card elements on a neighboring card.

As shown in FIG. 3B, neighboring line card 320 also includes one or more components 327, 328. In this example, component 327 is arranged in a configuration that corresponds to the levels 312, 314 on line card 300. For example, level (1) 312 and level (2) 314 of line card 300 receptively correspond to level (1) 322 and level (2) 324 of component 327 on line card 320. An advantage of arranging the card components in this manner is that the neighboring line cards are capable of more easily resting together in a nested configuration when mounted in particular mating direction.

FIG. 4 depicts a number of line cards (e.g., daughter cards) 420, 424 and 426 nested in a housing 400, such as a network switch system. In this example, the housing includes a backplane 403 with one or more slots, such as housing slot 405, attached to the backplane 403. Here, the slots are used as a mating terminal for a given line card. Similar to the line card 100 of FIG. 1, each line card in this example includes a card guide assembly to aid in the card's placement and removal from the backplane.

FIG. 5A-D depicts examples of a method of inserting a line card 422 into the housing 400 of FIG. 4. For example, a user may insert line card 422 in the housing 400 to mate the card with an available housing slot 405 attached the backplane 403. As discussed above, each line card in this example includes a card guide assembly to aid in nesting the cards in the housing 400. In this example, each card guide assembly varies in height from a first level to a second level. As shown in FIG. 5A, line card 422 may slide into the housing 400 at a starting level, for example, so that tall components like component 402 at one end of the card 422 are able to fit in between neighboring cards 420 and 424. This starting level corresponds to the first level of the card guide assembly attached to line card 422.

Turing to FIG. 5B, line card 422 is shown shifted up one level so that it can be guided further into the housing 400. For example, the z-lift features of line card 422 causes the card to shift up a certain height as the user pushes the line card 422 into the housing 400. By causing the line card 422 to shift up, the z-lift features allow the card to avoid components on neighborhood card 424 nested below. For this reason, the z-lift features of line card 422 are configured to correspond with an arrangement of components on the neighboring card 424. For example, the varying heights of the card guide assembly of line card 422 correspond to the height of the steps in component 407 of neighboring line card 424.

In FIG. 5C, the z-lift features of line card 422 cause it to shift up a certain height to one more level. This allows the tall components at the bottom of the card 422 to clear neighboring card 424. As discussed above, some components of line card 422 may be configured so as to assist in the z-lift features. For example, component 417 is shaped to include a step feature of varying heights. Here, the varying heights in the step of component 417 correspond to the card guide assembly on the neighboring line card 420 that is resting above line card 422. In some aspects, the step features on some card components allows the line cards to nest more closely together.

In FIG. 5D, line card 422 having safely cleared components on its neighboring cards 420 and 424 is then mated to backplane 403 at housing slot 405. To remove line card 422 from the housing slot 405, it can be guided past components on neighboring line cards by using the card guide assembly to guide the card out of the housing 400. In this regard, as the line card 422 reaches a certain point card guide assembly may cause the card 422 to shift down a level as oppose to shifting up to maneuver the card around components on neighboring cards. Although aspects of the disclosure generally relate to card guide assembly as guiding a line card to change its elevation at least two levels during insertion, the assembly can be implemented using multiple levels.

Figure 6:
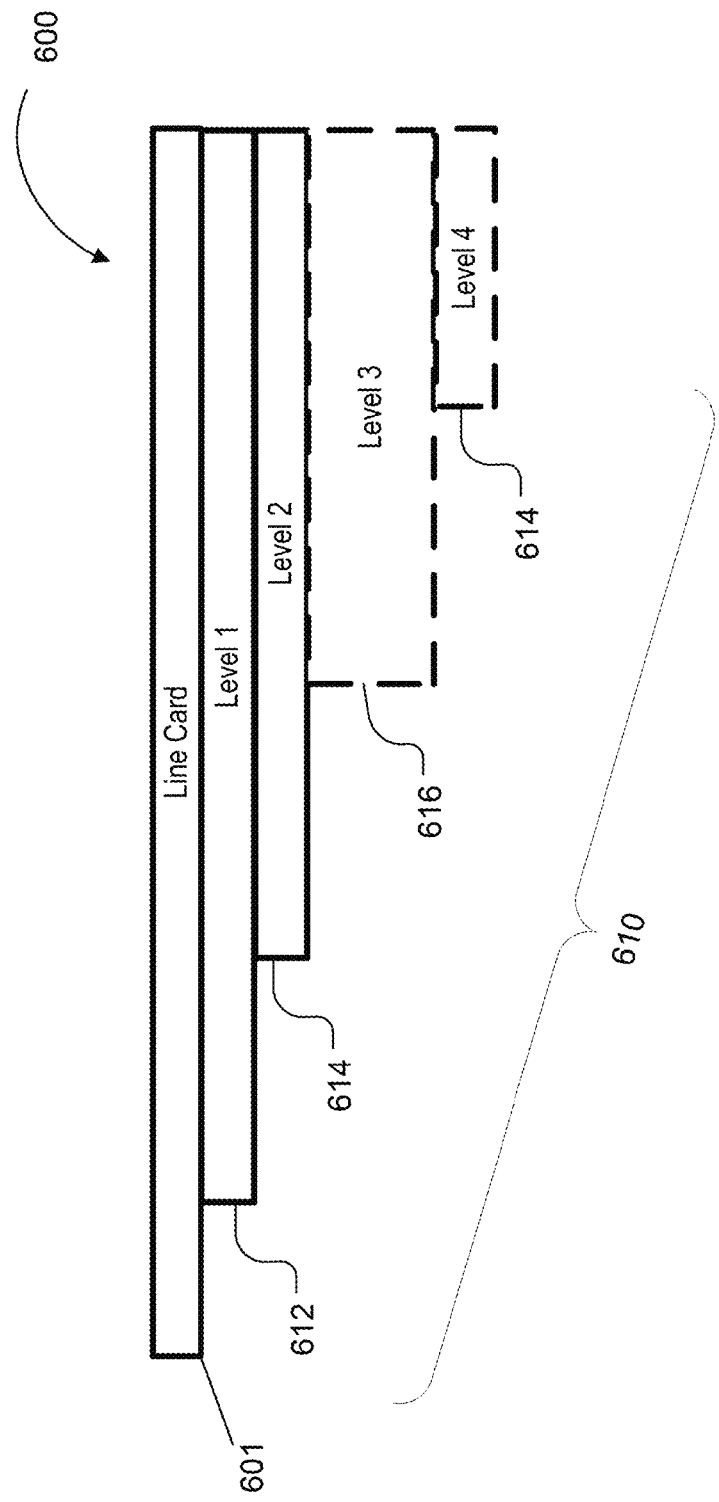
FIG. 6 depicts a cross sectional diagram of another line card in accordance with aspects of the disclosure.

FIG. 6 depicts a cross sectional diagram of another line card 600. As shown, the line card 600 includes a card guide assembly 610 disposed along a body 601 of the card. In this example configuration, the card guide assembly 610 includes a plurality, here four, of individual levels. As shown in FIG. 6, the card guide assembly 610 includes levels 612 and 614 as well as additional levels 616 and 618. Each of the levels corresponds to a configuration of card elements on a neighboring card. For example, each additional level can be added to a previous level on the card guide assembly 610 as needed to traverse any number of components of differing heights configured on a neighboring line card.

The above-described aspects of the present disclosure may be advantageous for mounting line cards in a "nested" configuration. This may be useful, for example, for achieving greater port density in a particular housing, such as a network switch. Such a higher port density system will have a lower overall height and a shorter backplane, which will allow the network switch to provide better signal integrity and an overall more robust system.

Other useful advantages in achieving a higher port density system includes requiring less rack space and/or data-center floor space for network servers and reducing the amount of pitch required between line cards stacked in a network server's chassis. By reducing the pitch, the need for available space for thermal solutions (e.g., heat sinks) and other large features to be implemented on the line cards can also be reduced.

Even further, by nesting the line cards using the techniques described herein, it may be possible to remove individual line cards from a server without having to remove a neighboring card that blocks an exit path. Thus, the server can be more efficiently serviced by not requiring that multiple cards be removed when only a single card needs to be serviced. Moreover, the individual line cards can be inserted and removed without damaging components on the other neighboring line cards.

As these and other variations and combinations of the features discussed above can be utilized without departing from the disclosure as defined by the claims, the foregoing description of the embodiments should be taken by way of illustration rather than by way of limitation of the disclosure as defined by the claims. It will also be understood that the provision of examples of the disclosure (as well as clauses phrased as "such as," "e.g.", "including" and the like) should not be interpreted as limiting the disclosure to the specific examples; rather, the examples are intended to illustrate only some of many possible embodiments.

The invention claimed is:

1. An aligning apparatus for mounting cards into a housing space, comprising:
   a first line card having a bottom surface, a top surface, and a mating portion, the mating portion configured to mate with a backplane of the housing space; and
   a card guide assembly on the bottom surface of the first line card, the card guide assembly varying from a first height at a first guide portion to a second height at a second guide portion, the varying heights forming one or more guide steps, the one or more guide steps corresponding to an arrangement of one or more components on a neighboring card, wherein the one or more components are shaped to be longer or higher at a first component portion than at a second component portion such that the one or more components form one or more component steps, the one or more component steps corresponding in size and position to the one or more guide steps;
   wherein the first and second portions are configured to guide directional movement of the first line card in relation to one or more components on the neighboring card during insertion of the first line card into the housing space,
   wherein the guide steps of the card guide assembly allow the first line card to rest in a nested configuration with the component steps of the neighboring line card when mounted in the housing space.

2. The aligning apparatus of claim 1, wherein the card guide assembly includes a tray coupled along a length of the first line card.

3. The aligning apparatus of claim 1, wherein the card guide assembly is configured to cause the first line card to shift at least a first distance perpendicular to a direction of insertion within the housing space.

4. The aligning apparatus of claim 3, wherein the first distance is substantially similar or greater than the first height of the card guide assembly.

5. The aligning apparatus of claim 3, wherein the card guide assembly is configured to cause the first line card to shift at least a second distance perpendicular to the direction of insertion within the housing space.

6. The aligning apparatus of claim 5, wherein the second distance is substantially similar or greater than the second height of the card guide assembly.

7. The aligning apparatus of claim 1, wherein the card guide assembly includes one or more rollers attached to the first and second portions.

8. The aligning apparatus of claim 7, further comprising one or more guide ramps positioned in the housing, wherein the guide ramps are configured to engage the rollers.

9. The aligning apparatus of claim 1, wherein the card guide assembly includes a third height at a third portion coupled to the second portion, wherein the third height associated with the third portion corresponds with the arrangement of components on the neighboring card.

10. The aligning apparatus of claim 1, wherein the mating portion is a connector, and the connector comprises pins that contact and form an electrical connection with pins disposed on the backplane when the card is in contact with the backplane.

11. A system for mounting cards, comprising:
    a housing having a backplane;
    a number of daughter cards, each daughter card having a bottom surface, a top surface, and a mating portion for mating with the backplane; and
    a card guide assembly on the bottom surface of each daughter card, the card guide assembly varying from a first height at a first guide portion to a second height at a second guide portion, the varying heights forming one or more guide steps, the one or more guide steps corresponding to an arrangement of one or more components on a neighboring daughter card, wherein the one or more components are shaped to be longer or higher at a first component portion than at a second component portion such that the one or more components form one or more component steps, the one or more component steps corresponding in size and position to the one or more guide steps;
    wherein the first and second portions are configured to guide directional movement of a given daughter card in relation to one or more components on the neighboring daughter card during insertion of the given daughter card into the housing,
    wherein the guide steps of the card guide assembly allow the given daughter card to rest in a nested configuration with the component steps of the neighboring daughter card when mounted in the housing.

12. The system of claim 11, wherein the card guide assembly includes a tray coupled along a length of the given daughter card with a first and second portion corresponding to the first and second portions of the card guide assembly.

13. The system of claim 11, wherein the card guide assembly is configured to cause the given daughter card to shift at least a first distance perpendicular to the direction of insertion within the housing.

14. The system of claim 13, wherein the first distance is substantially similar or greater than the first height of the card guide assembly.

15. The system of claim 13, wherein the card guide assembly is configured to cause the given daughter card to shift at least a second distance within the housing.

16. The system of claim 15, wherein the second distance is substantially similar or greater than the second height of the card guide assembly.

17. The system of claim 11, wherein the card guide assembly includes one or more rollers attached to the first and second portions.

18. The system of claim 17, further comprising one or more guide ramps positioned in the housing, wherein the guide ramps are configured to engage the rollers.

19. The system of claim 11, wherein the card guide assembly includes a third height at a third portion coupled to the second portion, wherein the third height associated with the third portion corresponds with the arrangement of components on the neighboring daughter card.

20. The system of claim 11, wherein the mating portion is a connector, and the connector comprises pins that contact and form an electrical connection with pins disposed on the backplane when the card is in contact with the backplane.

\* \* \* \* \*